United States Patent
Ginsburg et al.

(10) Patent No.: US 8,111,098 B2
(45) Date of Patent: Feb. 7, 2012

(54) SEGMENTED LINEAR FM POWER AMPLIFIER

(75) Inventors: Brian P. Ginsburg, Allen, TX (US); Mehmet Ozgun, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/789,351

(22) Filed: May 27, 2010

(65) Prior Publication Data

US 2011/0291753 A1 Dec. 1, 2011

(51) Int. Cl.
*H03F 1/02* (2006.01)
(52) U.S. Cl. ......... 330/9; 330/124 R; 330/295; 330/305
(58) Field of Classification Search .......... 330/9, 124 R, 330/295, 305
See application file for complete search history.

(56) References Cited

U.S. PATENT DOCUMENTS

| | | | | |
|---|---|---|---|---|
| 6,400,227 B1 * | 6/2002 | Goldfarb et al. | | 330/295 |
| 6,614,308 B2 * | 9/2003 | Moller et al. | | 330/295 |
| 7,417,508 B1 * | 8/2008 | Quaglietta | | 330/302 |
| 7,728,661 B2 * | 6/2010 | Bockelman et al. | | 330/51 |
| 7,729,445 B2 * | 6/2010 | Ravi et al. | | 375/297 |
| 7,764,125 B2 * | 7/2010 | Dawe | | 330/305 |
| 2007/0236295 A1 * | 10/2007 | Delano | | 330/302 |

* cited by examiner

*Primary Examiner* — Patricia Nguyen
(74) *Attorney, Agent, or Firm* — John R. Pessetto; W. James Brady; Frederick J. Telecky, Jr.

(57) ABSTRACT

Various apparatuses and methods for amplifying an FM signal in a segmented linear power amplifier are disclosed herein. For example, some embodiments provide an apparatus including a signal input, a signal output, and an output driver connected between the signal input and the signal output. The output driver includes a number of driver segments connected in parallel, each having an input connected to the signal input and each having an output. The output driver also includes a number of series capacitors, each associated with one of the driver segments. The series capacitors are each connected between the output of its associated driver segment and the signal output. The output driver also includes a number of shunt capacitors, each associated with one of the driver segments having an associated series capacitor. The shunt capacitors are each connected between the output of their associated driver segment and a ground.

10 Claims, 7 Drawing Sheets

SEGMENTED LINEAR FM POWER AMPLIFIER

BACKGROUND

FM-band transmitters find broad application in many types of wireless devices such as mobile cellular telephones. A typical FM antenna that is integrated in such mobile environments is an electrically small, high Q and highly inefficient antenna. An FM transmitter must be able to generate very large signal swings across the mobile antenna to produce radiated power at the antenna to meet regulatory requirements. These requirements are additionally difficult to satisfy in a mobile device designed to operate around the world, for example across about the 76-108 MHz bands.

Mobile cellular devices may also contain radio receivers on other bands, e.g., Global System for Mobile Communications (GSM), Wideband Code Division Multiple Access (WCDMA) and Global Positioning System (GPS). These other receivers lie at harmonic frequencies of the FM frequency, resulting in interference from the FM transmitter at harmonics of its fundamental frequency. Emissions from the FM transmitter at harmonics of the FM output frequency must therefore be strictly limited, while retaining the ability to linearly generate wide signal swing over a wide band into a high Q inductive antenna.

SUMMARY

Various apparatuses and methods for amplifying an FM signal in a segmented linear power amplifier are disclosed herein. For example, some embodiments provide an apparatus including a signal input, a signal output, and an output driver connected between the signal input and the signal output. The output driver includes a number of driver segments connected in parallel, each having an input connected to the signal input and each having an output. The output driver also includes a number of series capacitors, each associated with one of the driver segments. The series capacitors are each connected between the output of its associated driver segment and the signal output. The output driver also includes a number of shunt capacitors, each associated with one of the driver segments having an associated series capacitor. The shunt capacitors are each connected between the output of their associated driver segment and a ground.

An embodiment of the apparatus includes a number of transmission gates, each connected between the signal input and one of the driver segment inputs. The transmission gates are adapted to activate and inactivate a driver segment to which it is connected.

An embodiment of the apparatus includes a bias generator and a number of transmission gate controllers, each connected to one of the transmission gates. The bias generator includes a current source and current mirror. Each of the transmission gate controllers includes an output driver connected to the current mirror.

In an embodiment of the apparatus, the bias generator includes a diode-connected P channel transistor connected in series with a current source, and each of the transmission gate controllers includes a P channel transistor connected in series with an N channel transistor. The gate of the P channel transistor is connected to a voltage source through a first switch and to a gate of the diode-connected P channel transistor in the bias generator through a second switch.

In an embodiment of the apparatus, at least one transistor in each of the driver segments includes a plurality of parallel transistors which can be activated or inactivated to vary the strength of the driver segment transistor.

An embodiment of the apparatus includes a filtering network connected between the signal input and the output driver. The filtering network includes at least one integrator and at least one notch filter.

In an embodiment of the apparatus, the integrator includes at least one degeneration capacitor.

An embodiment of the apparatus includes a notch filter calibration circuit connected to the notch filter. The notch filter calibration circuit includes a first current source connected to a variable capacitor and a second current source connected to a resistor. A controller is connected to the variable capacitor and the resistor. The controller adjusts the capacitance of the variable capacitor to substantially equalize a voltage across the variable capacitor and a voltage across the resistor. The controller adjusts the capacitance in the notch filter based on the capacitance of the variable capacitor in the notch filter calibration circuit. The ratio between the first current source and the second current source is set according to an equation $I2/I1=2 \cdot \pi \cdot N$, wherein N is the harmonic number to be cancelled in the notch filter.

In an embodiment of the apparatus, each of the driver segments includes a DC biasing circuit connected to the driver segment output. Each DC biasing circuit includes an RC-connected diode in a DC feedback loop.

Other embodiments provide a method of amplifying a signal, including driving the signal through a segmented output driver, and controlling an output gain and tuning a matching network at an output of the segmented output driver by activating only a selected number of parallel output segments in the segmented output driver.

In an embodiment of the method, the activating tunes the matching network by combining a series capacitor at the output of each of the activated output segments. The voltage at the output of each of the plurality of parallel output segments that are not activated is divided by a series capacitor and a shunt capacitor.

In an embodiment of the method, a transmission gate is connected at an input to each of the output segments. The activating includes passing the signal through the transmission gates of the activated output segments and blocking the signal in the transmission gates of inactive output segments.

An embodiment of the method also includes controlling the output gain by adjusting the strength of at least one transistor in each of the parallel output segments.

An embodiment of the method also includes filtering the signal in at least one integrator and at least one notch filter before driving the signal through the segmented output driver.

In an embodiment of the method, the DC forward path gain is removed in the integrator using capacitive degeneration.

An embodiment of the method also includes calibrating the notch filter to a harmonic frequency of the FM fundamental frequency of the signal.

In an embodiment of the method, the calibrating includes setting the ratio between the current I1 through the variable capacitor and the current I2 through the resistor in the calibration circuit according to the equation $I2/I1=2 \cdot \pi \cdot N$, where N is the number of the harmonic to be cancelled in the notch filter.

An embodiment of the method also includes DC biasing the output of each of the parallel output segments in the segmented output driver using an RC-connected diode in a DC feedback loop.

Other embodiments provide an FM power amplifier including a filtering network connected to the signal input. The filtering network includes a charge pump integrator with capacitive degeneration, a first RC notch filter, a passive low pass filter, a Gm/C integrator with capacitive degeneration, and a second RC notch filter connected in series. A notch filter calibration circuit connected to the notch filters includes a first current source connected to a variable capacitor and a second current source connected to a resistor. A controller is connected to the variable capacitor and the resistor. The controller adjusts the capacitance of the variable capacitor to substantially equalize a voltage across the variable capacitor and a voltage across the resistor. The controller adjusts the capacitance in the notch filter based on the capacitance of the variable capacitor in the notch filter calibration circuit. The ratio between the first current source and the second current source is set according to the equation $I2/I1=2\cdot\pi\cdot N$, wherein N is the harmonic number to be cancelled in the notch filter. The FM power amplifier also includes a output driver connected between the filtering network and the signal output. The output driver includes a number of driver segments connected in parallel, each having an input connected to the signal input and each having an output. The output driver also includes a number of series capacitors, each associated with one of the driver segments. The series capacitors are each connected between the output of its associated driver segment and the signal output. The output driver also includes a number of shunt capacitors, each associated with one of the driver segments having an associated series capacitor. The shunt capacitors are each connected between the output of their associated driver segment and a ground.

This summary provides only a general outline of some particular embodiments. Many other objects, features, advantages and other embodiments will become more fully apparent from the following detailed description, the appended claims and the accompanying drawings.

BRIEF DESCRIPTION OF THE DRAWINGS

A further understanding of the various embodiments may be realized by reference to the figures which are described in remaining portions of the specification. In the figures, like reference numerals may be used throughout several drawings to refer to similar components.

DESCRIPTION

Figure 1:
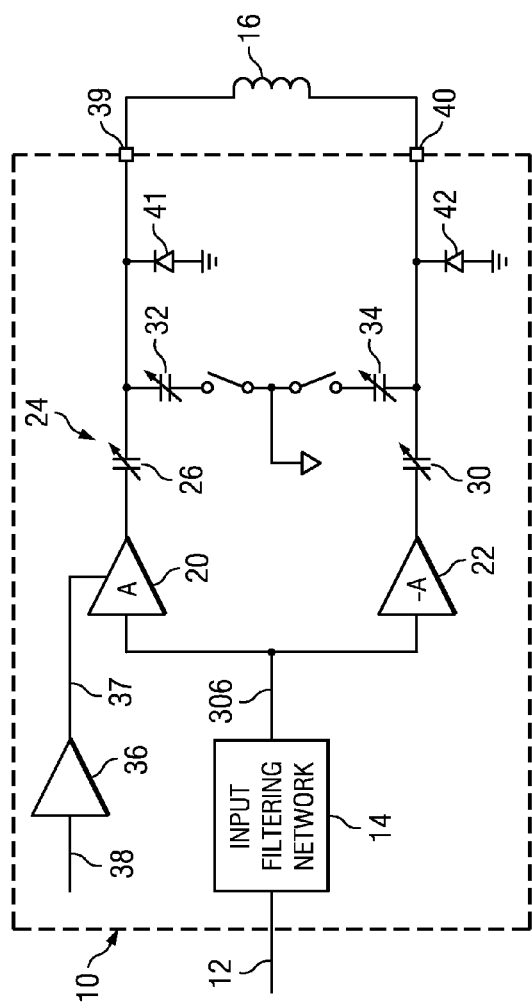
FIG. 1 depicts an example of an FM power amplifier containing an input filtering network, output driver and variable series and shunt output capacitors.

The drawings and description, in general, disclose various embodiments of a highly linear, segmented FM power amplifier for mobile devices such as cellular telephones. The drawings and description also disclose methods for amplifying a signal in an FM transmitter. The FM power amplifier is suitable for driving a signal to a small and inefficient loop antenna in a mobile device. In one embodiment, the FM power amplifier is adapted to produce swings of up to about 5.6V peak to peak to an antenna that has less than 1% efficiency in order to achieve a radiated power of about 50 nW. The FM power amplifier also greatly limits unwanted out of band emissions that might otherwise cause interference to radio receivers on the mobile device. For example, the seventh harmonic of a 108 MHz FM signal is 756 MHz and falls within one of the WCDMA bands, and other harmonics of the FM signal fall within various GSM, GPS and WCDMA bands. The FM power amplifier provides for a very large signal at the FM fundamental frequency while minimizing harmonic content to prevent interference with other radios on the same platform. The FM power amplifier disclosed herein also improves area and power efficiency and increases the supported range of antenna inductances across the frequency tuning range.

While FM is robust in the presence of nonlinearities in the saturation mode power amplifier, nonlinearities increase the disruption of victim receivers by harmonic signals. The FM power amplifier is therefore highly linear to minimize the impact of harmonics coupling into victim receivers on the same mobile device.

Embodiments of the FM power amplifier include cascaded integrators, notch filters, and a second order resonant network bandpass output structure to provide harmonic filtering. Large linear swing is provided in some embodiments by a class A differential output driver. The FM power amplifier may include some or all of these features, and is not limited to the specific examples illustrated in the drawings. For example, the FM power amplifier may be adapted with a single-ended output if desired.

Turning now to FIG. 1, the architecture of one embodiment of an FM power amplifier 10 will be discussed. The FM power amplifier 10 accepts a square wave on an input 12, filters the signal in a filtering network 14 and drives it onto an antenna 16. The filtering network 14 processes the FM modulated square wave signal at the input 12 and generates a close approximation of an FM modulated sine wave signal, thereby cancelling harmonics to a very high degree, particularly harmonics upwards of the 7th harmonic. The filtering network 14 also performs targeted filtering of harmonics that fall within victim bands.

A pair of output drivers 20 and 22 are used to drive the antenna 16 in differential mode. A matching network 24 which includes variable series and shunt capacitors 26, 30, 32 and 34 may be tuned according to the FM frequency to maximize resonance in the antenna 16 at the desired frequency. The antenna 16 in a mobile device is typically a loop antenna, such as a coil antenna or a loop of wire on a printed circuit board, and is a high Q antenna with high impedance. The efficiency of the antenna, i.e., the gain of the antenna, increases as the frequency of the application increases. As a result, interference due to higher frequency harmonics of the FM frequency can be transmitted and received by the antenna 16 with greater efficiency than the FM fundamental. To counteract this effect, because the loop antenna is high Q, if it is tuned properly for each transmit channel by the matching network 24 it attenuates out-of-band signals relatively effectively.

In one embodiment, the driver 22 and matching network 24 are powered by a low dropout regulator LDO 36 that provides a constant 2V supply 37 from a battery input 38. Thus, even with a typical battery that may range from about 2.3V to 5.5V, a constant voltage supply 37 is provided to the output drivers 20 and 22. However, the FM power amplifier 10 and the components thereof may be powered in any suitable manner and are not limited to the low-dropout regulator 36 of FIG. 1.

The outputs 39 and 40 of the FM power amplifier 10 may be protected from ESD strikes by diodes 41 and 42.

Figure 2:
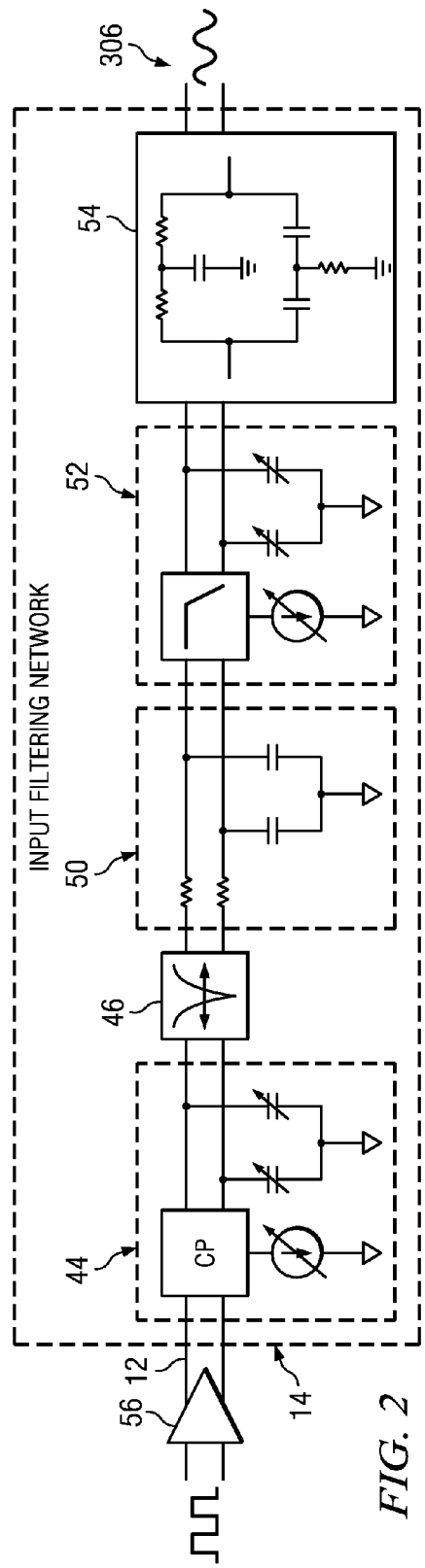
FIG. 2 depicts an example of an input filtering network.

Referring now to FIG. 2, an embodiment of the filtering network 14 will be described in more detail. In this embodiment, the filtering network 14 includes a large signal integrator 44, notch filter 46, passive low pass filter 50, small signal integrator 52 and second notch filter 54. Various embodiments of a filtering network for use in an FM power amplifier 10 may include some or all of these components or variations thereof, in the order illustrated in FIG. 2 or in other suitable configurations based on the filtering requirements of the system. The notch filters in one embodiment are twin-T RC notch filters that are tuned based on the FM frequency to attenuate specific harmonics that fall within victim bands. A current mode logic (CML) amplifier 56 may also be used to amplify the FM modulated square wave signal before filtering in the filtering network 14 if desired.

Figure 3:
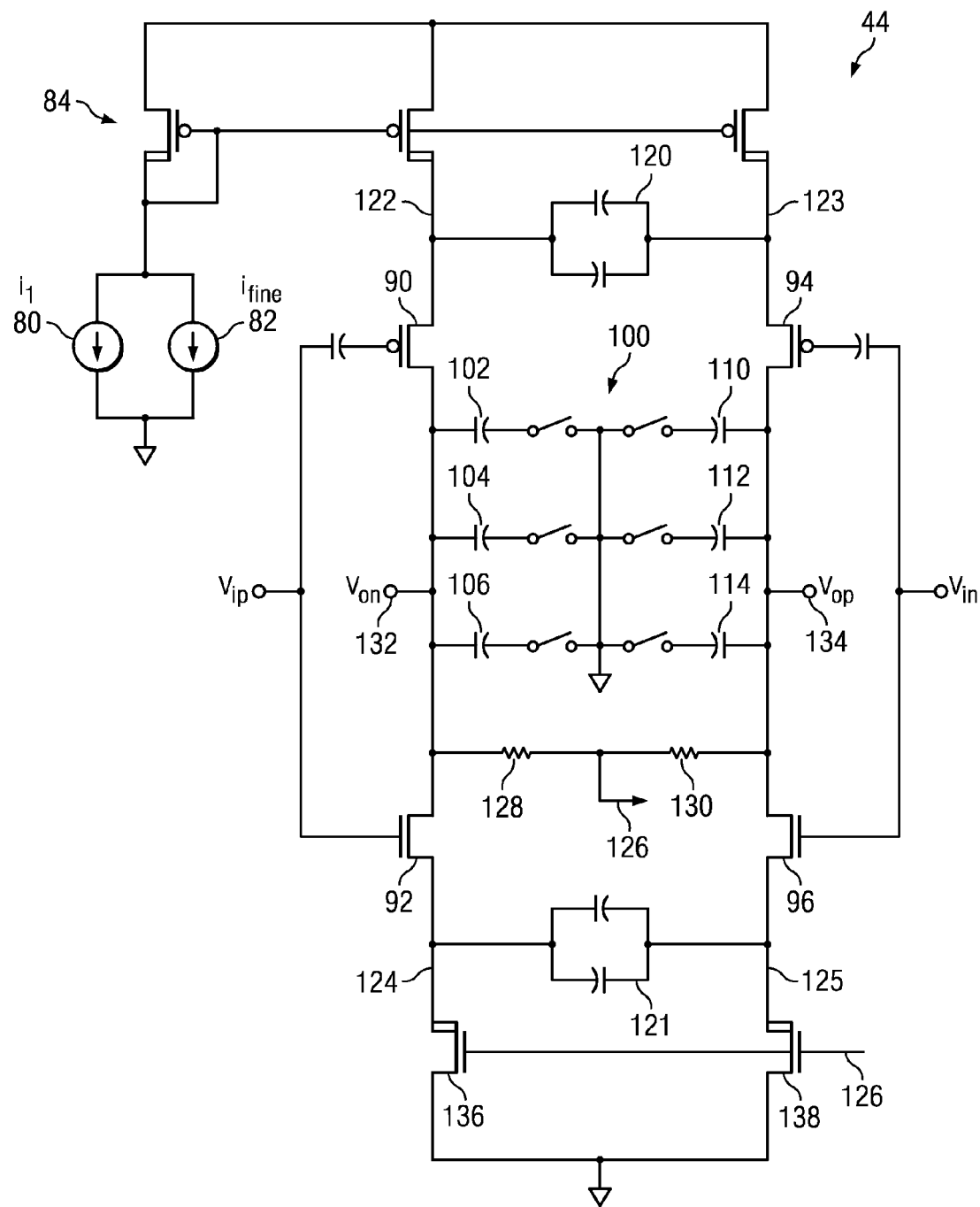
FIG. 3 depicts an example of a charge pump integrator.

The large signal integrator 44 in one embodiment comprises a charge pump integrator as illustrated in FIG. 3. Current supplies 80 and 82 provide coarse and fine current control to the integrator 44 through a current mirror 84, providing part of the overall gain tuning for the power amplifier 10, along with output driver gain tuning described in more detail below. A switching network including transistors 90, 92, 94 and 96 control charge to a group 100 of integrating capacitors. The integrating capacitors 100 have a number of switched capacitors 102, 104, 106, 110, 112 and 114 that can be set according to the FM frequency to provide a flatter gain response across the FM channel. The transistors 90-96 in the switching network are fully switched by digital control signals to commutate current alternatingly either onto the N-side integrating capacitors 102, 104 and 106 or the P-side integrating capacitors 110, 112 and 114.

Because integrators typically have very large DC gain, any DC bias such as that due to duty cycle distortion in the input signal would lead to a very large DC output offset and would potentially saturate the output drivers 20 and 22. To prevent this, the DC forward path gain is removed using capacitive degeneration. Degeneration capacitors 120 and 121 are connected between the N and P current supply nodes 122 and 123 and between the N and P current sink nodes 124 and 125 to cancel the DC gain of the integrator 44. A common mode feedback loop signal 126 is driven by a pair of resistors 128 and 130 connected between the N-side output 132 and P-side output 134 to control current limiting transistors 136 and 138. The capacitive degeneration results in a zero DC gain through the integrator 44, and the size of the degeneration capacitors 120 and 121 is chosen such that at the FM frequencies, the capacitor impedance is much less than the impedance seen looking into the source nodes of transistors 90-96. Thus, the degeneration capacitors 120 and 121 act as a short circuit at FM frequencies, which maintains the same equivalent integration gain in-band and for the harmonics. This is more area-efficient than DC feedback cancellation and much more robust to duty cycle distortion than AC coupling.

Figure 4:
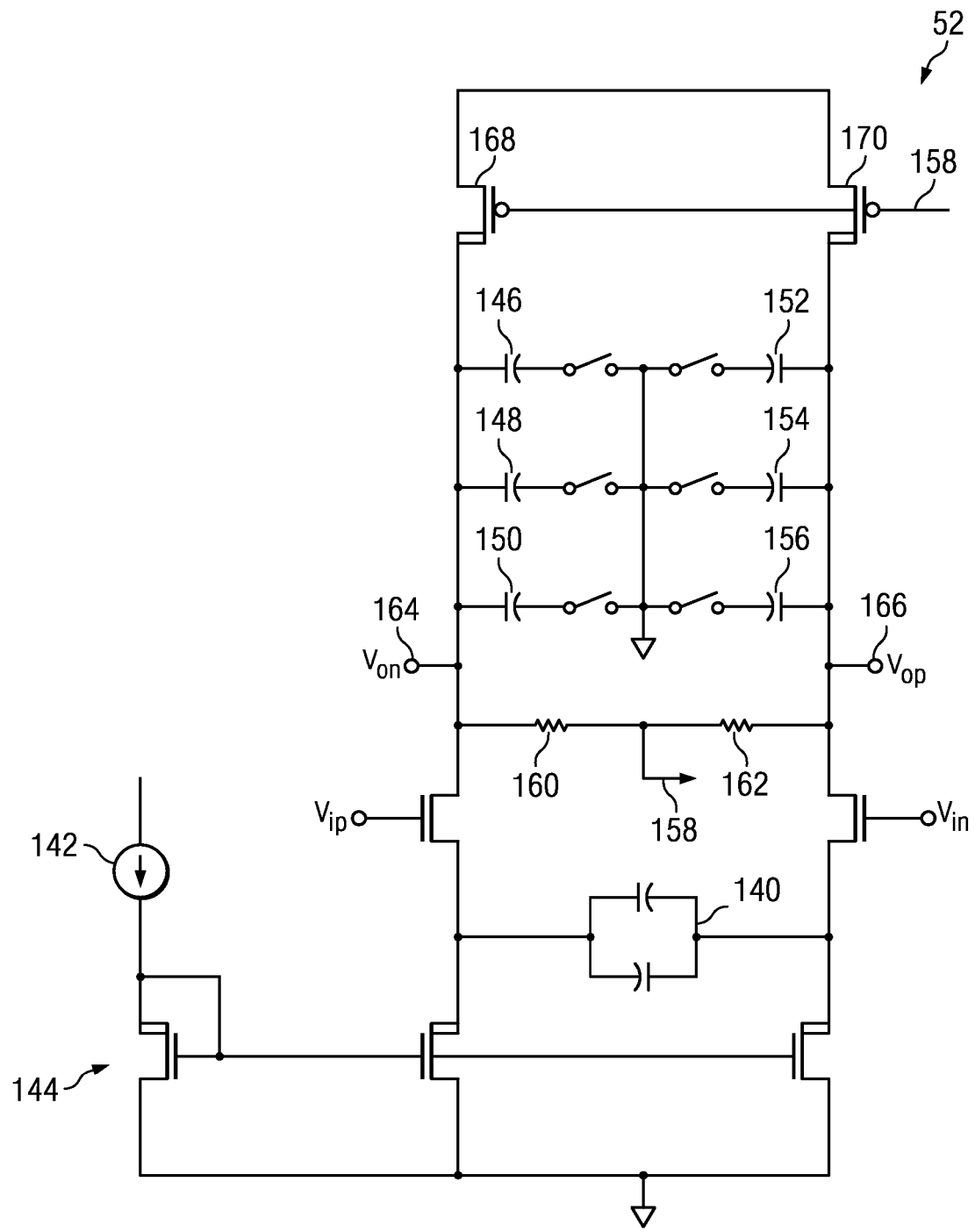
FIG. 4 depicts an example of a Gm/C integrator.

The second integrator 52 operates as a GM/C integrator and also includes a degeneration capacitor 140 as illustrated in FIG. 4 to remove the DC forward path gain. The integrator 52 is a small signal integrator and includes a current supply 142 and current mirror 144 to control the charging rate to the integrating capacitors 146, 148, 150, 152, 154 and 156. A common mode feedback loop signal 158 is driven by a pair of resistors 160 and 162 connected between the N-side output 164 and P-side output 166 to control current limiting transistors 164 and 166.

The RC notch filters 46 and 54 are each tuned to cancel a specific harmonic of the FM fundamental frequency. Based on the FM frequency, a calculation is made to determine which harmonics are going to fall in the band of a victim receiver. A master-slave feedback loop is used to adjust the switched capacitors in the twin-T notch filters 46 and 54 to filter out those harmonics. The master-slave feedback loop may include current sources I1 and I2 driving a resistor and a switched capacitor, and an A/D converter to produce a digital signal used to control the capacitor banks in the notch filter switched capacitors. Harmonic frequencies are targeted in the notch filters 46 and 54 rather than the fundamental by selecting an appropriate current ratio between the R and C branches in the master RC calibration sampling circuit so that the RC product in the twin-T notch filters 46 and 54 is an integer multiple of the FM fundamental frequency. The switched capacitors in the notch filters 46 and 54 are adjusted in a calibration at startup and each time the FM frequency is tuned. The notch filters 46 and 54 are thus calibrated to the proper location, providing very good cancellation of specific spurs, and the other harmonics that are not causing impact are attenuated in the filtering network 14 but not specifically targeted like those that are in the victim bands.

Figure 5:
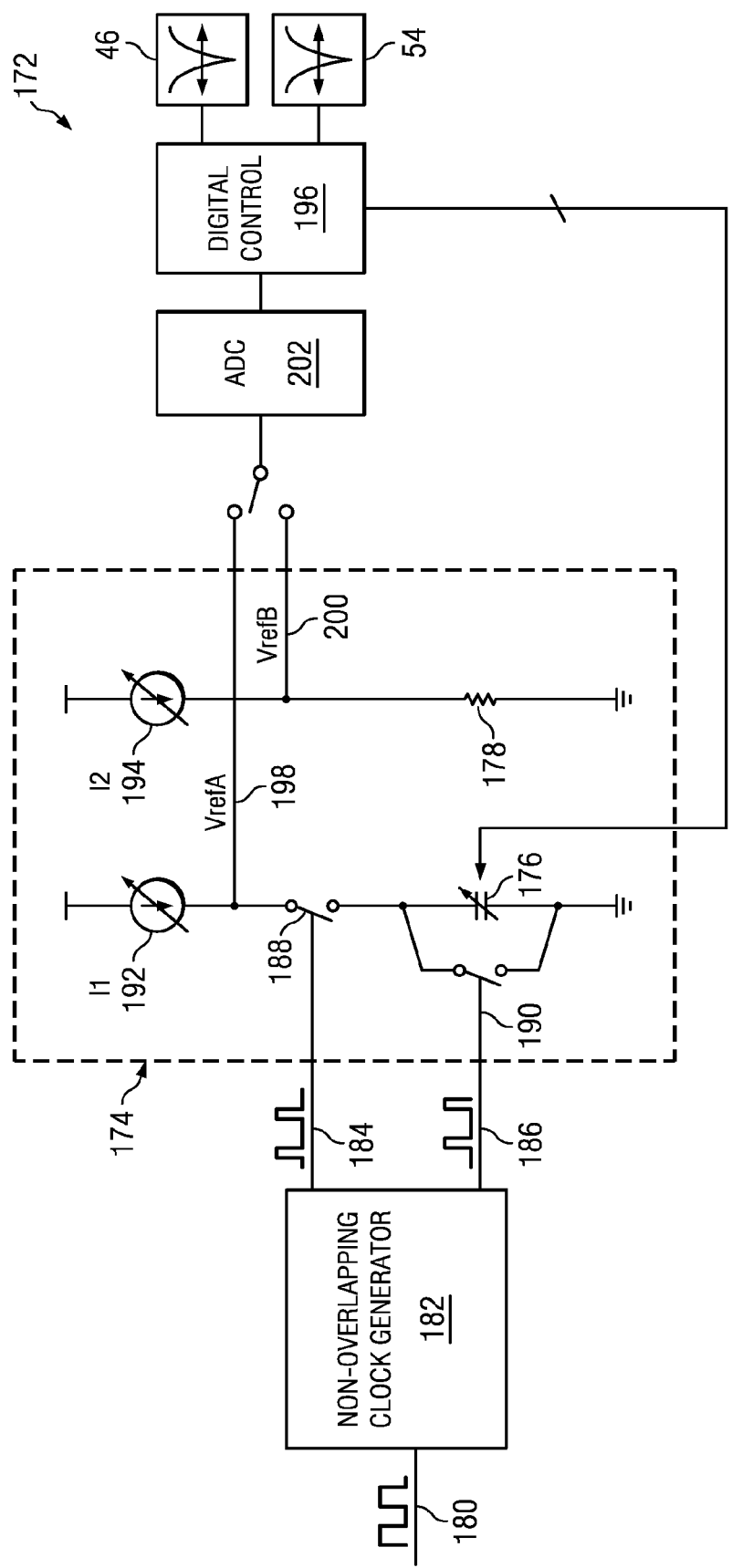
FIG. 5 depicts an example of a calibration circuit for calibrating RC notch filters in the input filtering network.

An example of an RC notch filter calibration circuit 172 is illustrated in FIG. 5. A sampling circuit 174 includes a variable capacitor 176 and a resistor 178 that replicate the capacitance and resistance in the RC notch filters 46 and 54 in the filtering network 14. The variable capacitor 176 and a resistor 178 are used in the RC notch filter calibration circuit 172 to identify the appropriate capacitance to use in the RC notch filters 46 and 54 to filter out particular harmonics of the FM fundamental frequency in the FM power amplifier 10. An input clock 180 at the FM fundamental frequency is used in a non-overlapping clock generator 182 to generate two non-overlapping clocks 184 and 186. These clocks 184 and 186 control switches 188 and 190 that alternately charge and discharge the variable capacitor 176 from a DC current source I1 192 connected in series with the variable capacitor 176. A second DC current source I2 194 is connected in series with the replica resistor 178. The ratio between the current sources I1 192 and I2 194 is selected so the RC product in the RC notch filters 46 and 54 and between the replica variable capacitor 176 and resistor 178 is harmonically related to the FM fundamental frequency. This may be accomplished by setting the current sources I1 192 and I2 194 according to the equation $I2/I1 = 2 \cdot \pi \cdot N$, where N is the number of the harmonic to be cancelled, for example between 7 and 12 depending on the FM fundamental frequency and the frequencies of the victim bands in the mobile radio. Once the current sources I1 192 and I2 194 are set at the proper ratio and the variable capacitor 176 is being charged and discharged at the FM fundamental frequency, a digital controller 196 adjusts the capacitance of the variable capacitor 176 until the voltage VrefA 198 across the variable capacitor 176 equals the voltage VrefB 200 across the resistor 178, as measured by an analog to digital converter (ADC) 202. The digital controller 196 may use any of a number of suitable search algorithms to adjust the variable capacitor 176 until VrefA 198 equals VrefB 200, such as a binary search. Once the appropriate capacitance has been identified, the capacitance in the RC notch filters 46 and 54 is adjusted with the capacitance identified by the RC notch filter calibration circuit 172. The RC notch filters 46 and 54 may both be adjusted to filter out the same harmonic frequency, or each may be adjusted to filter out a different harmonic frequency by running the calibration scheme twice in the RC notch filter calibration circuit 172 with different values of N.

Referring again to FIG. 1, the output drivers 20 and 22 also greatly reduce interference on victim bands using a variety of improvements which may all be included together or which may be selected piecemeal for inclusion in an FM power amplifier 10. In some embodiments, the output drivers 20 and 22 have a pseudo-differential structure driving from both sides of the antenna 16 at a lower voltage than conventional single-ended output drivers, such as 2V on each output driver 20 and 22, thereby limiting the interference caused by each. In some embodiments, a segmented driver structure enables changes in series capacitance 26 and 30 in the matching network 24 and greatly improves tuning range and filtering. Again, each of these embodiments to be described in more detail below may be combined or may be included piecemeal.

The matching network 24 is tuned to resonate at the FM frequency with the loop antenna 16, which is modeled as an inductor. The FM band is very wide, and it can be difficult to tune a matching network over the entire FM band using only shunt capacitors 32 and 34. It is relatively straightforward to tune shunt capacitors 32 and 34 using capacitor banks with switches between the capacitors in the banks and ground, and the varied capacitance can be very linear with very high $C_{ON}$ to $C_{OFF}$ ratios. In contrast, it is much more difficult to tune series capacitors 26 and 30. By tuning the series capacitors 26 and 30, the voltage gain across the series capacitors 26 and 30 can be adjusted as well as supporting a wider tuning range and providing better driver efficiency for the class A drivers 20 and 22.

Figure 6:
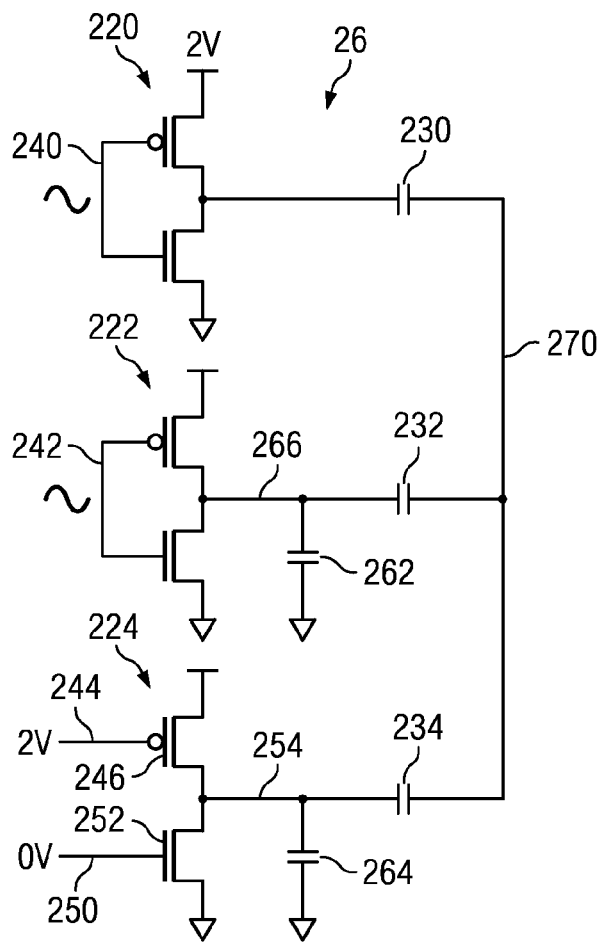
FIG. 6 depicts an example of a matching network with segmented series capacitors and with shunt capacitors.

Rather than adding switches in series with the series capacitors 26 and 30 to vary their capacitance, which would be quite nonlinear due to the large voltage swings across them, the output drivers 20 and 22 and the series capacitors 26 and 30 are segmented. As illustrated in FIG. 6, the output driver is divided into multiple segments 220, 222 and 224, each with a series capacitor 230, 232 and 234. The segments 220, 222 and 224 combine in parallel to form the series capacitor (e.g., 26) in the matching network 24. Each driver segment 220, 222 and 224 can be switched on and off to include its associated series capacitor 230, 232 and 234, rather than adding switches across the series capacitor 26. The output driver can be divided into as many segments as desired, and may be divided equally or in other proportions. For example, the driver segments 220, 222 and 224 of FIG. 6 are divided into three equal segments, each one third the size of the desired overall output driver.

In the example of FIG. 6, the upper two segments 220 and 222 are turned on, with the filtered FM signal applied to their gates 240 and 242. The lower segment 224 is turned off by tying the gate 244 of the PFET 246 to 2V and the gate 250 of the NFET 252 to ground, thereby setting its output node 254 to a high impedance. In this case, the effective series capacitance is series capacitor 230 plus series capacitor 232. Shunt capacitors 262 and 264 are added between the output nodes 266 and 254 and ground for segments 222 and 224 that may be switched off to adjust series capacitance 26. The shunt capacitors 262 and 264 may be switched in when a segment 222 and 224 is turned off, and switched out when they are turned on.

The voltage swing at the overall output node 270 is about 2.8V peak to peak in one embodiment. Without the shunt capacitors 262 and 264, the transistors (e.g., 246 and 252) in the output segments 222 and 224 could not be turned off over the entire $2.8V_{PP}$ range, because the $2.8V_{PP}$ swing at the segment output node 254 is greater than the 2V supply 37 powering the output drivers 20 and 22. The transistors 246 and 252 would rectify the output signal which is very nonlinear and would cause undesirable interference with victim radios. Shunt capacitors 262 and 264 form capacitive dividers with the series capacitors 232 and 234, attenuating the signal swing at the segment output nodes 254 and 266 so that it fits safely within the supply rails without turning on the transistors (e.g., 246 and 252). This enables the series capacitor 26 to be adjusted while still maintaining linearity when switched driver segments (e.g., 224) are turned off and other drivers (e.g., 220 and 222) are turned on.

The desired series capacitance may be selected based on factors such as the FM frequency and the desired gain. Gain can be controlled by adjusting the strength of the drivers as will be discussed below, and by turning on and off driver segments (e.g., 222 and 224), and both techniques may be employed together or separately as desired to obtain the appropriate gain level and antenna tuning.

Figure 7:
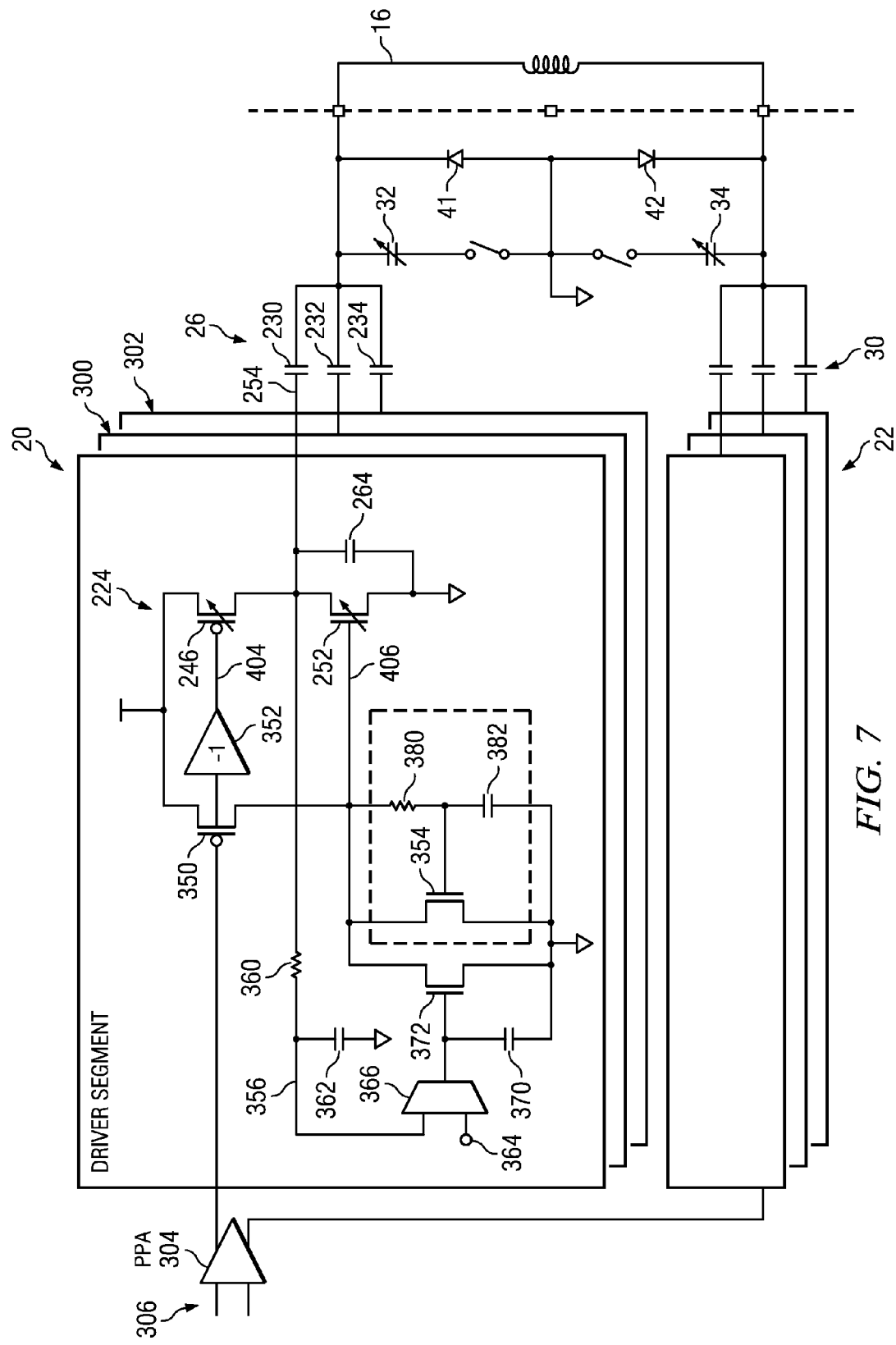
FIG. 7 depicts an example of a segmented output driver.

Turning now to FIG. 7, the top level architecture of the output drivers 20 and 22 and the matching network 24 will now be discussed. In FIG. 7, details of the output driver 20 with output driver segment 224 are shown, with other segments 220 and 222 contained in rear boxes 300 and 302. The output drivers 20 and 22 may include a pre-power amplifier (PPA) 304 to amplify the substantially sinusoidal FM signal 306 from the filtering network 14. The PPA 304 may comprise a standard differential amplifier pair with resistive load. A common mode feedback loop inside the PPA can set its output common mode to provide the bias for the PFET 224 in the driver. Again, as will be described in more detail below, each of the driver segments (e.g., 224) is adjustable. In some embodiments, this applies only to the P side driver 20, in other embodiments both the P side driver 20 and N side driver 22 have adjustable output driver segments. The PPA 304 directly drives the PFET 246 of the driver 224, while the NFET 252 is driven by another transistor 350 based on the PPA 304. Although an inverter 352 is shown, this function may be performed by selecting the appropriate differential output of the PPA 304 to drive the PFET 246.

The internal PFET 350 is mirrored down to an RC-connected diode 354, so the voltage signal driving the internal PFET 350 is turned into a current which is mirrored across the diode 354 effectively to drive the NFET 252. Thus, the PFET 246 and NFET 252 are driven with the same voltage swing but at different DC potentials to be able to track uniformly over process, temperature and fluctuations due to transistor reliability.

A DC feedback loop 356 from the output node 254 is used to bias the output node 254 at the mid-supply voltage of 1V. The DC feedback loop 356 is filtered by resistor 360 and capacitor 362 and is compared with a mid-supply voltage reference 364 by an operational transconductance amplifier (OTA) 366. The output of the OTA 366 drives a relatively large capacitor 370 which provides filtering and dominant pole stability. The OTA 366 also drives the gate of an NFET 372. Because of the variation between the PFET 246 and NFET 252, the voltage at the output node 254 may tend away from the mid-supply DC bias, and the DC feedback loop 356 uses the NFET 372 to control the gate voltage of the NFET 252 until the DC bias at the output node 254 is stabilized at mid-supply.

A resistor 380 and capacitor 382 form a filter for the diode-connected transistor 354, which otherwise would process the FM signal. Because a diode connected device is rather nonlinear and would add harmonic content and interfere with victim radios on the mobile device, the resistor 380 and capacitor 382 are used to prevent the addition of harmonic content. The pole of the RC filter is placed well below the FM band such that at FM frequencies, the gate of the RC-connected diode 354 is grounded through the capacitor 382. The RC-connected diode 354 therefore effectively acts as a current source and the FM frequency AC signal is merely amplified and converted from a current to a voltage across the resistor 380, which is a much more linear operation than if the FM signal was going across the diode 354. The RC-connected diode 354 solves both DC biasing and AC linearity constraints.

Figure 8:
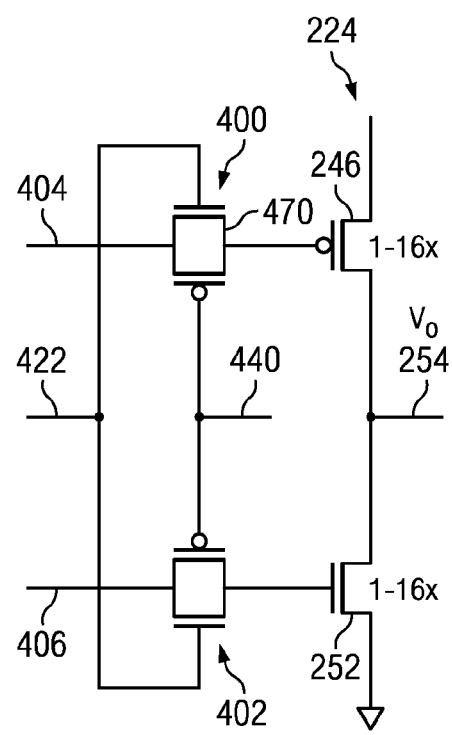
FIG. 8 depicts an example of an output driver with variable width output stage driven by transmission gates.

Turning now to FIG. 8, the adjustable driver transistors 246 and 252 will be described. By varying the strength of the driver transistors 246 and 252 the gain of an output driver (e.g., 20) can be controlled. Again, the gain and frequency tuning in the FM power amplifier 10 may be balanced and performed together based on frequency and power requirements while minimizing nonlinearity in the FM power amplifier 10 which would lead to interference with victim radios on the mobile device. Each transistor PFET 246 and NFET 252 may comprise an array of switched transistors connected in parallel which can be activated or deactivated to provide the desired overall driver width. Transmission gates 400 and 402 (seen in FIG. 8, not shown in FIG. 7) are used to drive the PFET 246 and NFET 252 under the control of the driver control signals 404 (from PPA 304) and 406. However, while the transmission gate (e.g., 400) is closed, the nonlinear gate capacitance of the transmission gate (e.g., 400) is charged and discharged by the fluctuation of the AC signal present on node 404, and this nonlinear charging and discharging causes a significant amount of nonlinear current to be injected onto the output node 254.

Figure 9:
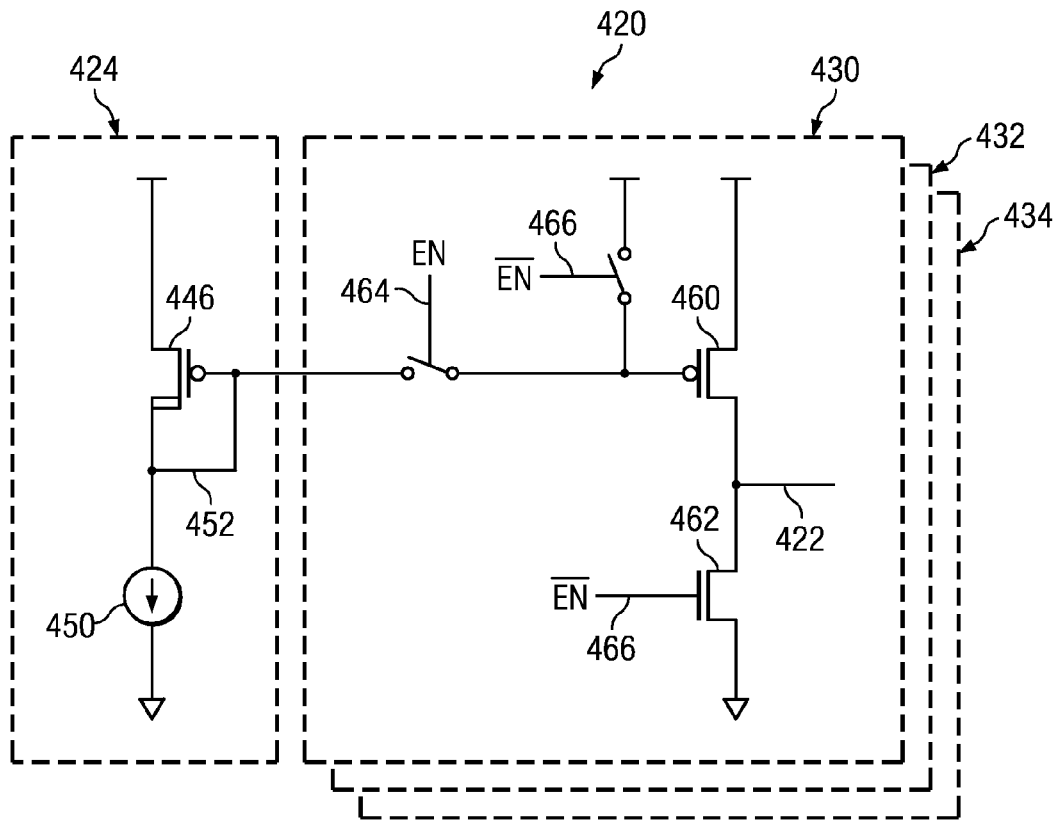
FIG. 9 depicts an example of a transmission gate drive circuit.

To reduce this nonlinear current injection, a transmission gate drive circuit 420 (FIG. 9) is used to produce a high impedance on the control signal 422 to the N channel gate of the transmission gates 400 and 402 when on. The transmission gate drive circuit 420 includes a bias generator 424 shared by all driver segments in an output driver 20, and a set of transmission gate controllers 430, 432 and 434, one per driver segment 224, 220 and 222. A symmetric transmission gate drive circuit is provided for the P channel gate 440 of the transmission gates 400 and 402.

The bias generator 424 includes a diode-connected PFET 446 and current source 450 in series, with a central node 452 connected to each transmission gate controller (e.g., 430). Each transmission gate controller (e.g., 430) includes a PFET 460 and NFET 462 in series between the supply voltage and ground. The gate of the PFET 460 is switchably connected to the bias generator 424 under the control of an EN signal 464 and to the supply voltage under the control of an $\overline{EN}$ signal 466, which is the inverse of the EN signal 464. The diode-connected PFET 446 in the bias generator 424 acts as a current mirror with the PFET 460, with the current controlled by the current source 450. The gate of the NFET 462 is controlled by the $\overline{EN}$ signal 466.

During operation, the gate of the NFET 470 in the transmission gate 400 would be connected to 2V when on. But instead of connecting it to 2V strongly through a large linear region device, using the transmission gate drive circuit 420 it is connected to 2V through a very weakly-on PFET 460, which is a small PFET with only a minimal gate drive, producing a high impedance as seen from its drain. From a DC perspective it is at 2V, but from an AC perspective node 422 is at a high impedance. Thus when there is a swing on the source and drain nodes of the transmission gate 400, some of that signal will couple to the gate node 422 which is at a high impedance, and there will be some swing on the gate node 422 as well which will be in phase with the source and drain nodes (e.g., 404). This reduces the amount of AC swing across the gate-source nodes of the transmission gate 400, such that the fundamental component will be reduced, which significantly reduces harmonic content. If the fundamental content is reduced by 6 db, the harmonic content drops over 40 db.

Figure 10:
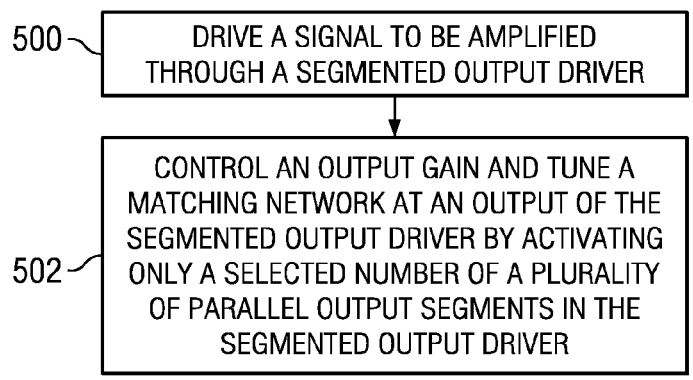
FIG. 10 depicts a flow chart of an example of a method for amplifying a signal in an FM transmitter.

A method of amplifying a signal in a segmented linear FM power amplifier is summarized in the flow chart of FIG. 10. The signal is driven through a segmented output driver. (Block 500) The output gain is controlled and a matching network at an output of the segmented output driver is tuned by activating only a selected number of parallel output segments in the segmented output driver. (Block 502) Various embodiments of the method may also include weakly driving transmission gates to activate output driver segments to maintain linearity as described above. Various embodiments of the method may also include filtering the signal in a filtering network, including in integrators with capacitive degeneration to block a DC forward path gain, and in notch filters calibrated to block one or more harmonics of the FM fundamental frequency as described above.

The segmented linear FM power amplifier disclosed herein may be used for example to increase the output power in a transmitter while limiting interference with victim radios in a mobile device, particularly at harmonics of the fundamental FM frequency. Linearity in the segmented FM power amplifier is maximized to further limit interference with victim radios. The power amplifier disclosed herein may provide substantial benefits in other applications and is not limited to the examples described above.

While illustrative embodiments have been described in detail herein, it is to be understood that the concepts disclosed herein may be otherwise variously embodied and employed.

What is claimed is:

1. An apparatus for amplifying a signal, the apparatus comprising:
   a signal input;
   a signal output; and
   an output driver connected between the signal input and the signal output, the output driver comprising:
      a plurality of driver segments connected in parallel, each having an input connected to the signal input and each having an output;
      a plurality of series capacitors, each associated with one of the plurality of driver segments, wherein the plurality of series capacitors is each connected between the output of its associated driver segment and the signal output; and
      a plurality of shunt capacitors, each associated with one of the plurality of driver segments having an associated series capacitor, wherein the plurality of shunt capacitors is each connected between the output of its associated driver segment and a ground;
      a plurality of transmission gates, each connected between the signal input and one of the plurality of driver segment inputs, wherein the transmission gates are adapted to activate and inactivate a driver segment to which it is connected.

2. The apparatus of claim 1, further comprising a bias generator and a plurality of transmission gate controllers, each of the plurality of transmission gate controllers being connected to one of the plurality of transmission gates, the bias generator comprising a current source and current mirror, each of the plurality of transmission gate controllers comprising an output driver connected to the current mirror.

3. The apparatus of claim 1, further comprising a bias generator and a plurality of transmission gate controllers, each of the plurality of transmission gate controllers being connected to one of the plurality of transmission gates, the bias generator comprising a diode-connected P channel transistor connected in series with a current source, each of the plurality of transmission gate controllers comprising a P channel transistor connected in series with an N channel transistor, a gate of the P channel transistor connected to a voltage source through a first switch and to a gate of the diode-connected P channel transistor in the bias generator through a second switch.

4. An apparatus for amplifying a signal, the apparatus comprising:
a signal input;
a signal output; and
an output driver connected between the signal input and the signal output, the output driver comprising:
a plurality of driver segments connected in parallel, each having an input connected to the signal input and each having an output;
a plurality of series capacitors, each associated with one of the plurality of driver segments, wherein the plurality of series capacitors is each connected between the output of its associated driver segment and the signal output; and
a plurality of shunt capacitors, each associated with one of the plurality of driver segments having an associated series capacitor, wherein the plurality of shunt capacitors is each connected between the output of its associated driver segment and a ground;
wherein at least one transistor in each of the plurality of driver segments comprises a plurality of parallel transistors, wherein the at least one transistor in each of the plurality of driver segments is adapted to have a variable strength by activating a subset of the plurality of parallel transistors.

5. An apparatus for amplifying a signal, the apparatus comprising:
a signal input;
a signal output; and
an output driver connected between the signal input and the signal output, the output driver comprising:
a plurality of driver segments connected in parallel, each having an input connected to the signal input and each having an output;
a plurality of series capacitors, each associated with one of the plurality of driver segments, wherein the plurality of series capacitors is each connected between the output of its associated driver segment and the signal output; and
a plurality of shunt capacitors, each associated with one of the plurality of driver segments having an associated series capacitor, wherein the plurality of shunt capacitors is each connected between the output of its associated driver segment and a ground;
a filtering network connected between the signal input and the output driver, the filtering network comprising at least one integrator and at least one notch filter.

6. The apparatus of claim 5, wherein the at least one integrator comprises at least one degeneration capacitor.

7. The apparatus of claim 5, further comprising a notch filter calibration circuit connected to the at least one notch filter, the notch filter calibration circuit comprising:
a first current source;
a variable capacitor connected to the first current source;
a second current source;
a resistor connected to the second current source; and
a controller connected to the variable capacitor and the resistor, the controller being adapted to adjust a capacitance of the variable capacitor to substantially equalize a voltage across the variable capacitor and a voltage across the resistor, the controller further being adapted to adjust a capacitance in the at least one notch filter based on the capacitance of the variable capacitor in the notch filter calibration circuit.

8. The apparatus of claim 7, wherein a ratio between the first current source and the second current source is set according to an equation $I2/I1=2\cdot\pi\cdot N$, wherein N comprises a harmonic number to be cancelled in the at least one notch filter.

9. An apparatus for amplifying a signal, the apparatus comprising:
a signal input;
a signal output; and
an output driver connected between the signal input and the signal output, the output driver comprising:
a plurality of driver segments connected in parallel, each having an input connected to the signal input and each having an output;
a plurality of series capacitors, each associated with one of the plurality of driver segments, wherein the plurality of series capacitors is each connected between the output of its associated driver segment and the signal output; and
a plurality of shunt capacitors, each associated with one of the plurality of driver segments having an associated series capacitor, wherein the plurality of shunt capacitors is each connected between the output of its associated driver segment and a ground;
each of the plurality of driver segments comprising a DC biasing circuit connected to the driver segment output, each DC biasing circuit comprising an RC-connected diode in a DC feedback loop.

10. An FM power amplifier comprising:
a signal input;
a filtering network connected to the signal input, the filtering network comprising a charge pump integrator with capacitive degeneration, a first RC notch filter, a passive low pass filter, a Gm/C integrator with capacitive degeneration, and a second RC notch filter connected in series;
a notch filter calibration circuit connected to the first and second RC notch filters, the notch filter calibration circuit comprising:
a first current source;
a variable capacitor connected to the first current source;
a second current source;
a resistor connected to the second current source; and
a controller connected to the variable capacitor and the resistor, the controller being adapted to adjust a capacitance of the variable capacitor to substantially equalize a voltage across the variable capacitor and a voltage across the resistor, the controller further being adapted to adjust a capacitance in the at least one notch filter based on the capacitance of the variable capacitor in the notch filter calibration circuit, wherein a ratio between the first current source and the second current source is set according to an equation $I2/I1=2\cdot\pi\cdot N$, wherein N comprises at least one harmonic number to be cancelled in the first and second RC notch filters;
a output driver connected between the filtering network and the signal output, the output driver comprising:
a plurality of driver segments connected in parallel, each having an input connected to the signal input and each having an output;
a plurality of series capacitors, each associated with one of the plurality of driver segments, wherein the plurality of series capacitors is each connected between the output of its associated driver segment and the signal output; and
a plurality of shunt capacitors, each associated with one of the plurality of driver segments having an associated series capacitor, wherein the plurality of shunt capacitors is each connected between the output of its associated driver segment and a ground.

* * * * *